(12) United States Patent
Onishi et al.

(10) Patent No.: US 7,583,089 B2
(45) Date of Patent: Sep. 1, 2009

(54) MEASUREMENT SYSTEM OF SPECIFIC ABSORPTION RATE

(75) Inventors: Teruo Onishi, Yokohama (JP); Katsuki Kiminami, Yokosuka (JP); Shinji Uebayashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 632 days.

(21) Appl. No.: 11/169,646

(22) Filed: Jun. 30, 2005

(65) Prior Publication Data

US 2006/0012530 A1     Jan. 19, 2006

(30) Foreign Application Priority Data

Jul. 5, 2004    (JP)    ............................... 2004-198050
Jun. 29, 2005    (JP)    ............................... 2005-189720

(51) Int. Cl.
*G01R 27/04*     (2006.01)

(52) U.S. Cl. ...................................... 324/632; 324/637

(58) Field of Classification Search ................. 324/632, 324/637; 343/702
See application file for complete search history.

(56) References Cited

U.S. PATENT DOCUMENTS

| | | | | |
|---|---|---|---|---|
| 5,363,050 A | * | 11/1994 | Guo et al. | .................... 324/638 |
| 6,525,657 B1 | | 2/2003 | Wojcik | |
| 2004/0017115 A1 | * | 1/2004 | Ozaki et al. | .................. 307/149 |

2006/0012530 A1    1/2006   Onishi et al.

FOREIGN PATENT DOCUMENTS

| | | |
|---|---|---|
| EP | 1 070 966 A1 | 1/2001 |
| EP | 1 326 070 A1 | 7/2003 |
| EP | 1 359 428 A2 | 11/2003 |
| WO | WO 2004079299 A2 * | 9/2004 |

OTHER PUBLICATIONS

Thomas Schmid, et al., "Automated E-Field Scanning System for Dosimetric Assessments", IEEE Transactions on Microwave Theory and Techniques, vol. 44, No. 1, Jan. 1996, pp. 105-113.
M. Y. Kanda, et al., "Fast Sar Determination of Gram-Averaged Sar From 2-D Coarse Scans", The Bioelectromagnetics Society 25th Annual Meeting, Jun. 22-27, 2003, pp. 45-46.

(Continued)

*Primary Examiner*—Vincent Q Nguyen
(74) *Attorney, Agent, or Firm*—Oblon, Spivak, McClelland, Maier & Neustadt, P.C.

(57) ABSTRACT

A specific absorption rate measuring apparatus including a probe configured to measure, in a two-dimensional plane, the amplitude and the phase of an electric or magnetic field generated in a phantom of which electrical properties similar to a human body tissues; an electric and/or magnetic field estimation unit configured to estimate a three-dimensional electric field distribution to be produced from a wave source defined by the two-dimensional electric and magnetic fields at a measuring point, based on the measurement results of the probe; and a specific absorption rate estimation unit configured to estimate a three-dimensional distribution of specific absorption rate based on the estimation result of the electric field estimation unit.

20 Claims, 13 Drawing Sheets

OTHER PUBLICATIONS

M. G. Douglas, et al., "Post-Processing Errors in Peak Spatial-Average Sar Measurements of Wireless Handsets", The Bioelectromagnetics Society 25$^{th}$ Annual Meeting, Jun. 22-27, 2003, pp. 370-371.

O. Merckel, et al., "Extension of the Parametric Rapid Sar Measurement to the Sam Phantom", 6$^{th}$ International Congress of the European Bioelectromagnetics Association, Nov. 13-15, 2003, p. 38.

Morgan Brishoual, et al., "Methodology to Interpolate and Extrapolate SAR Measurements in a Volume in Dosimetric Experiment", IEEE Transactions on Electromagnetic Compatibility, vol. 43, No. 3, XP-011019755, Aug. 2001, pp. 382-389.

Michael Y. Kanda, et al., "Faster Determination of Mass-Averaged SAR From 2-D Area Scans", IEEE Transactions on Microwave Theory and Techniques, vol. 52, No. 8, XP-002347215, Aug. 2004, pp. 2013-2020.

Anonymous: "Map SAR2 SAR-Mapping Tool for Wireless Devices", Internet Article, Online!, XP-002347216, Jun. 4, 2004, pp. 1-6.

O. Merckel, et al., "Parametric Model Approach for Rapid SAR Measurements", Instrumentation and Measurement Technology Conference, vol. 11, XP-010735852, pp. 178-183.

U.S. Appl. No. 11/873,934, filed Oct. 17, 2007, Kiminami, et al.

* cited by examiner

MEASURING APPARATUS

RADIATING DEVICE

RADIATING DEVICE

MEASURING APPARATUS

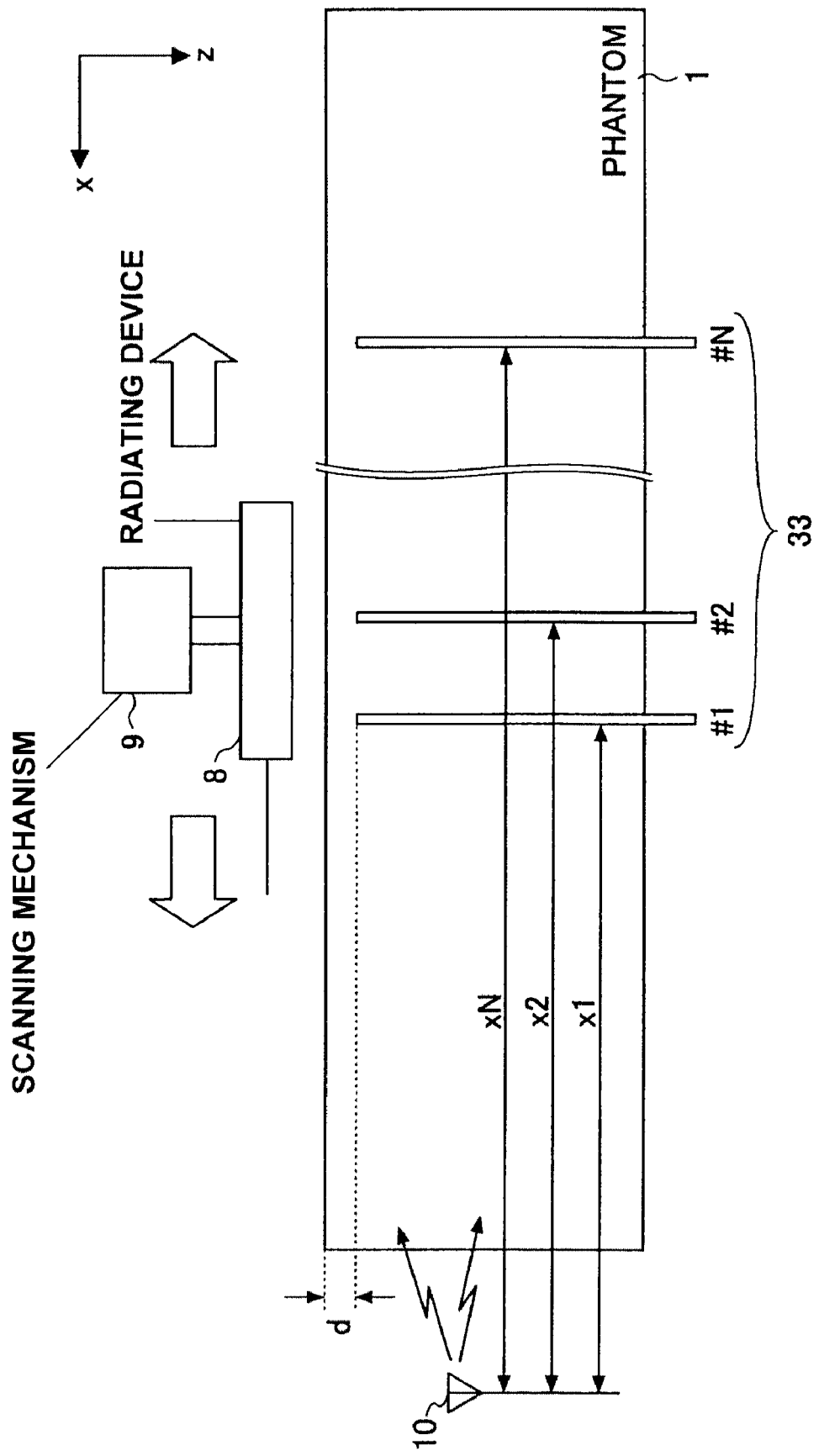

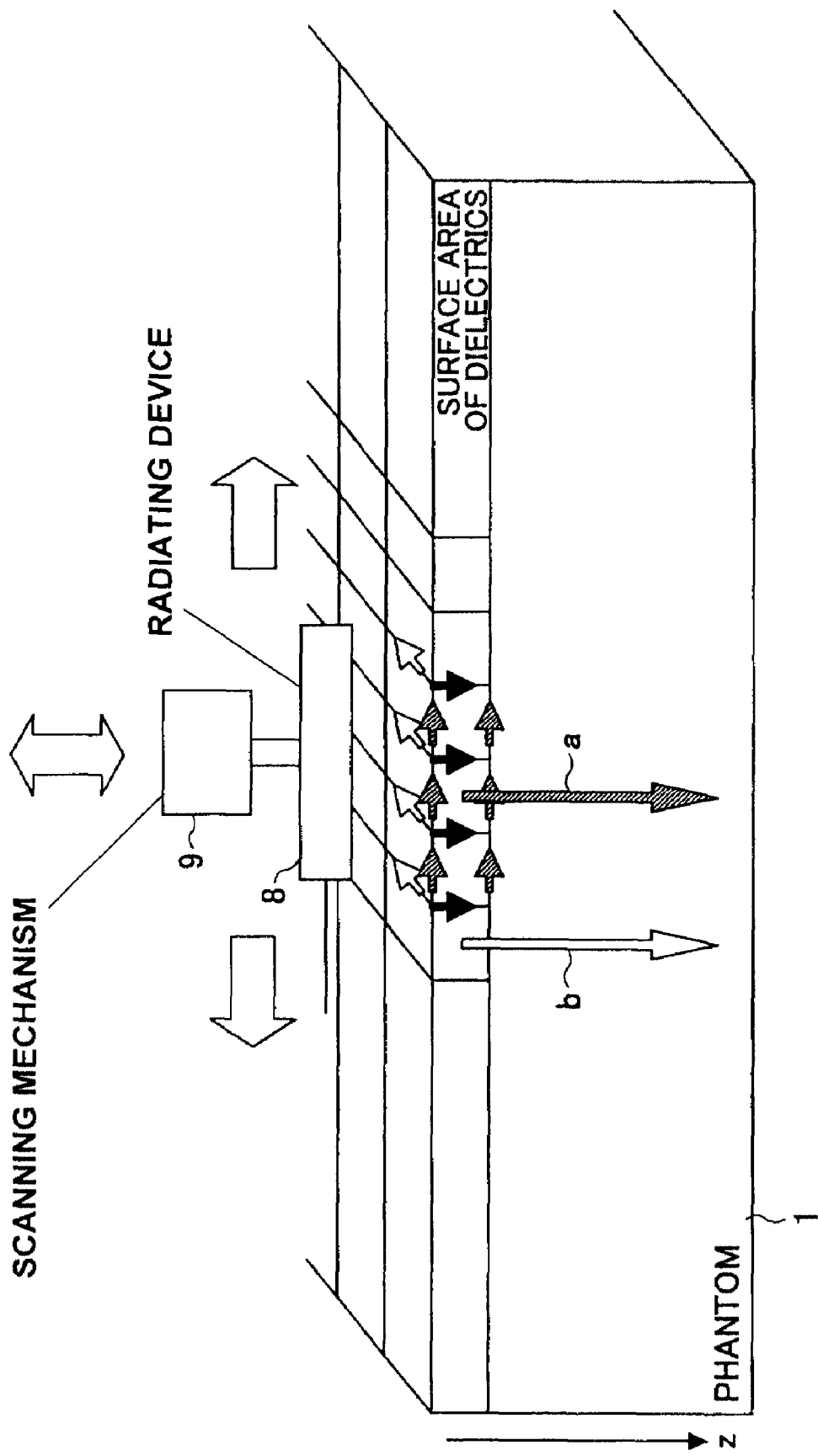

ated by an electromagnetic wave radiating device in a medium; and (b) a processor configured to determine a specific absorption rate based on the measurement result of the probe.

MEASUREMENT SYSTEM OF SPECIFIC ABSORPTION RATE

BACKGROUND OF THE INVENITON

1. Field of the Invention

The present invention generally relates to measurement of specific absorption rate (SAR), and more particularly, to an SAR measuring apparatus capable of quick and accurate measurement of a specific absorption rate.

2. Description of the Related Art

Specific absorption rate (SAR) is an index used to estimate an electric power level absorbed in a human body when a cellular phone is operated near the human body. SAR level is expressed by $$SAR = \frac{\sigma |E|^2}{\rho} \quad (1)$$

where $\sigma$ is electric conductivity [S/m] of a medium, $\rho$ is density [kg/m$^3$] of the medium, and E is electric field [V/m]. See, for example, Thomas Schmid, Oliver Egger, and Niels Kuster, "Automated E-Field Scanning System for Dosimetric Assessment", IEEE Trans. MTT-44, No. 1, pp. 105-113, January 1996.

Conventionally, when measuring specific absorption rate (SAR) values, electric field E generated in the medium is detected using a short dipole, and the detected electric field is converted to a specific absorption rate using Equation (1).

FIG. 1 is a schematic diagram illustrating a conventional specific absorption rate (SAR) measuring system. A phantom 11A, which is a human body model simulated using a liquid material having an electric properties similar to those of human tissues, is defined in a vessel 12. On the bottom of the vessel 12 is provided an electromagnetic wave radiating device 18, such as a cellular phone, to be observed to measure the influence on the human body. An electric field probe 13 is inserted and scanned in the phantom 11A by a positioning equipment 14 in the three-dimensional directions (x, y, and z directions) to detect the electric field generated in the phantom 11A. Based on the electric field measurement, specific absorption rate values are computed. The probe 13 is connected to an electric field measuring apparatus 16 via a signal transmission cable 15. The electric field detecting apparatus 16 determines the electric field levels based on the signal supplied from the probe 13 via the cable 15. A processor 17 controls the overall operations of the SAR measurement, as well as carrying out SAR computation and data analysis.

In the probe scan to measure the electric field in the phantom 11A, the electric field probe 13 is first driven in a two-dimensional manner along the bottom of the vessel 12 to acquire a two-dimensional SAR distribution. This scan is called area scan. A high SAR area is found by the area scan, and then, a three-dimensional scan is performed for the high SAR area and its vicinity to acquire more detailed (three-dimensional) information about the SAR distribution. This scan is called zoom scan.

FIG. 2 is a schematic diagram illustrating another conventional SAR measuring system, in which a solid phantom 11B is used. The electric field probe 13 is movable in the z direction, or alternatively, multiple probes are placed in the phantom 11B at different depths. The electromagnetic wave radiating device 18 is moved in the two-dimensional directions (x and y directions) by the scanning mechanism 19, while the electric field probe 13 is moved in the z direction. Using this arrangement, the electric field generated in the phantom 11B is measured, and SAR distribution is determined from the electric field measurement. The other operations are the same as those shown in FIG. 1.

In this manner, three-dimensional measurement of an electric field is performed by moving the electric field probe 13 in the three-dimensional directions in the phantom 11A in the example shown in FIG. 1, and by moving both the electric field probe 13 and the electromagnetic wave radiating device 18 to detect the three-dimensional distribution of the electric field in the phantom 11B in the example shown in FIG. 2. In either case, a specific absorption rate is obtained from the electric field measurement result.

However, the above-described measurement method has a problem in that two-step measurement for area scan and zoom scan has to be performed in order to obtain detailed information about the SAR distribution. This method requires time to complete the measurement.

To solve this problem, it is proposed to perform two-dimensional area scan (in the x-y plane) only and to calculate the electric field of the remaining dimension (in the z direction) based on the area scan measurement result using Equation (2), for the purpose of reducing measurement time.

$$SAR(x,y,z)=SAR(x,y,z_d)S(z,z_d) \quad (2)$$

See, for example, M. Y. Kanda, M. Ballen, M. G. Douglas, A. V. Gessner and C. K. Chou, "Fast SAR determination of gram-averaged SAR from 2-D coarse scans", Abstract Book of the Bioelectromagnetics Society 25th Annual Meeting, Jun. 22-27, 2003; and M. G. Douglas, M. Y. Kanda and C. K. Chou, "Post-processing errors in peak spatial average SAR measurements of wireless handsets", Abstract Book of the Bioelectromagnetics Society 25th Annual Meeting, Jun. 22-27, 2003.

In Equation (2), SAR(x, y, z) is an SAR estimate value at three-dimensional coordinates (x, y, z), and SAR(x, y, $z_d$) is an SAR measurement result at z=$z_d$. S(z, $z_d$) is a function with respect to the depth direction (the z direction), By appropriately selecting function S(z, $z_d$), a three-dimensional SAR distribution can be determined from a two-dimensional measurement.

Another known estimation method is to determine a three-dimensional SAR distribution using an elliptic function, based only on two-dimensional SAR measurements and one linear SAR measurements in the depth direction. See, for example, O. Merckel, J.-Ch. Bolomey, G. Fleury, "Extension of the parametric rapid SAR measurement to the SAM phantom", Abstract Book of the 6th International Congress of the European Bioelectromagnetics Association, Nov. 13-15, 2003.

In the above-described method, the SAR distribution in the depth direction is estimated based on the two-dimensional SAR measurement result in order to reduce the measurement time. However, since the parameters in the estimating equations are determined empirically or approximately, it is difficult to estimate SAR distributions accurately under various situations. Due to this circumstance, the SAR measurement accuracy falls (producing uncertainty error), and accordingly, accurate measurement cannot be expected.

SUMMARY OF THE INVENTION

The present invention is conceived in view of the above-described problems in the prior art, and it is an object of the invention to provide a specific absorption rate measuring apparatus that realizes fast and accurate SAR measurement.

To achieve the object, in one aspect of the invention, a specific absorption rate measuring apparatus includes (a) a probe configured to measure, in a two-dimensional plane, amplitude and phase of an electric or magnetic field generated in a phantom of which electrical properties similar to those of human body tissues; (b) an electric field estimation unit configured to estimate a three-dimensional electric field distribution to be produced from the two-dimensional electric and magnetic fields at a measuring point as wave sources, based on the measurement result of the probe; and (c) a specific absorption rate estimation unit configured to estimate three-dimensional distribution of the specific absorption rate based on the estimation result of the electric field estimation unit.

With this arrangement, the specific absorption rate is estimated from two-dimensional measurement results based on theoretical estimation, instead of empirical or approximate estimation. Consequently, both efficiency (fast measurement and high accuracy) are satisfied in SAR measurement.

BRIEF DESCRIPTION OF THE DRAWINGS

Other objects, features, and advantages of the invention becomes more apparent from the following detailed description when read in conjunction with the accompanying drawings, in which

FIG. 14 is a schematic diagram illustrating an example of calibration using a reference antenna; and FIG. 15 is a schematic diagram illustrating an application of a combination of equivalent theorem and decay function.

DETAILED DESCRIPTION OF THE PREFERRED EMBODIMENT

The present invention is described in detail below in conjunction with the attached drawings.

Figure 1:
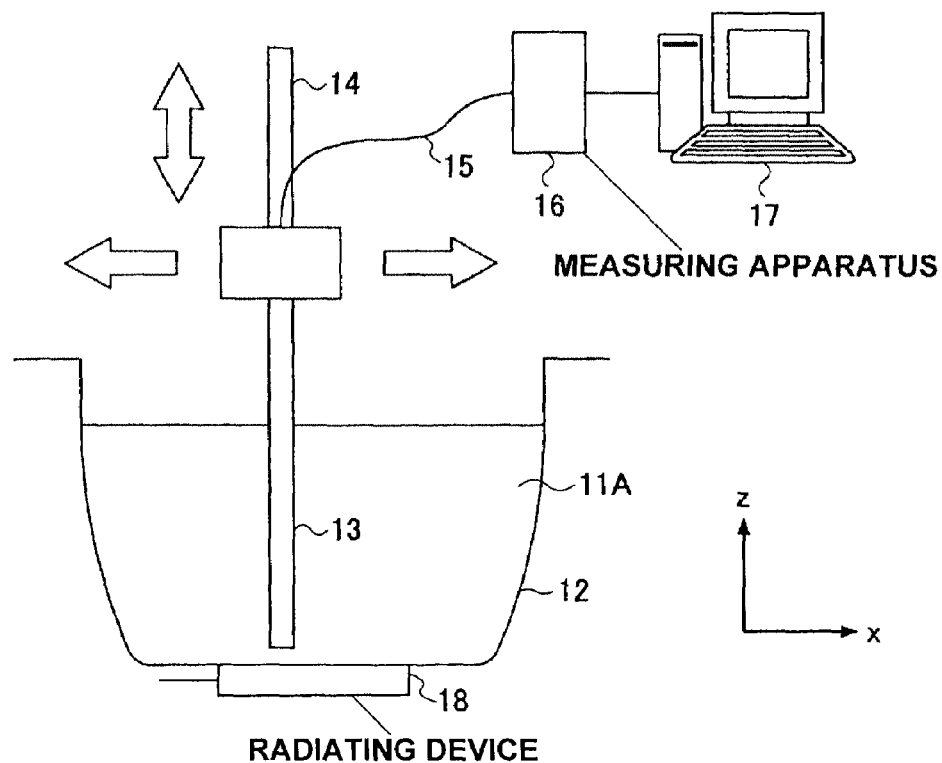
FIG. 1 is a schematic diagram illustrating an example of the conventional SAR measuring system.
Figure 2:
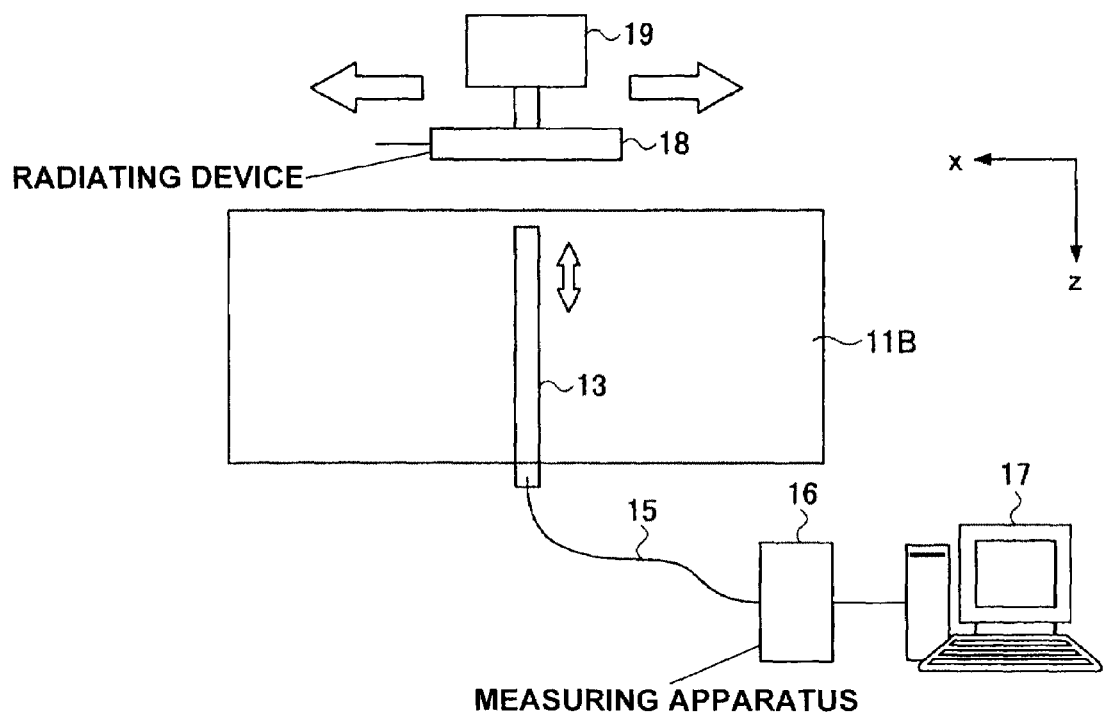
FIG. 2 is a schematic diagram illustrating another example of the conventional SAR measuring system.
Figure 3:
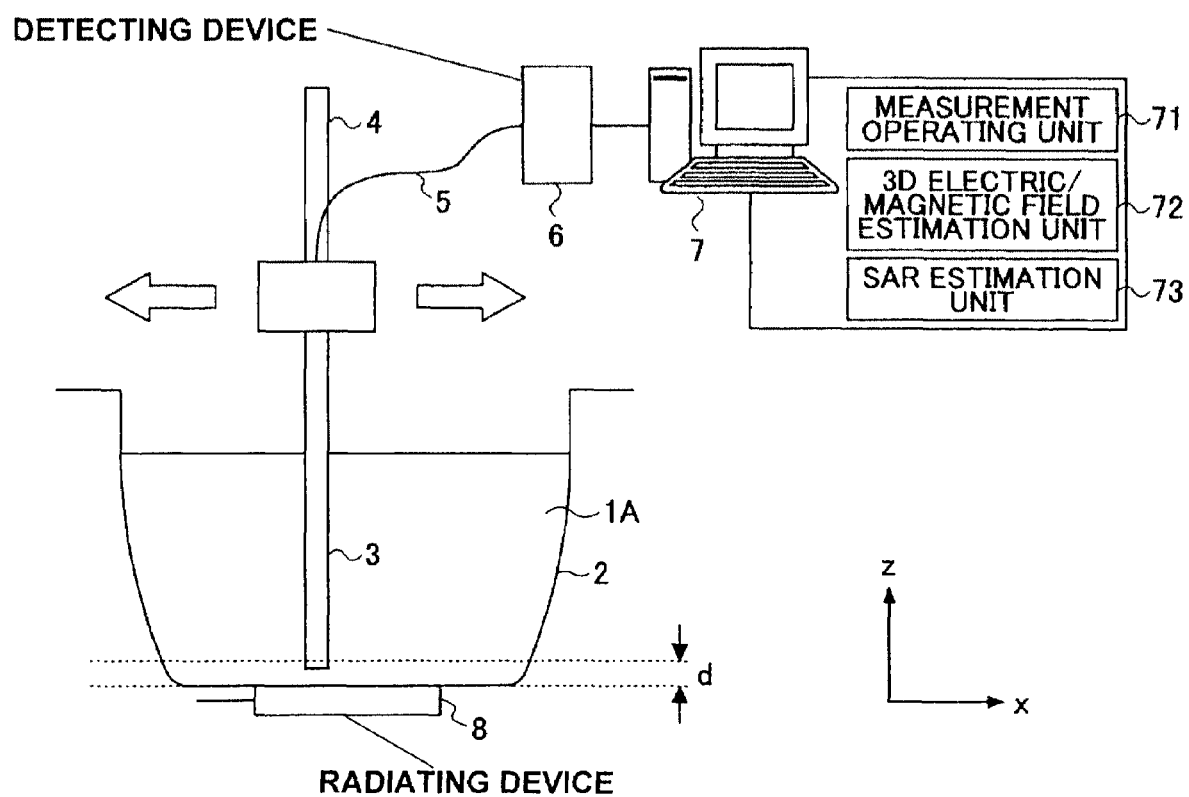
FIG. 3 is a schematic diagram illustrating an SAR measuring apparatus according to an embodiment of the invention.

FIG. 3 is a schematic diagram of a specific absorption rate (SAR) measuring apparatus according to an embodiment of the invention. The SAR measuring apparatus includes a phantom 1A of which electrical properties similar to those of human body tissues using a liquid material filling a vessel 2, an electromagnetic wave radiating device 8, such as a cellular phone, attached to the outer face of the bottom of the vessel 2, and an electric/magnetic field probe 3 configured to measure the amplitude and the phase of the electric field and magnetic fields generated in the phantom 1A and output an signal. The SAR measuring apparatus also includes a probe positioning equipment 4 that moves the electric/magnetic field probe 3 in a two-dimensional plane (e.g., in the x-y plane), a detector 6 connected to the electric/magnetic field probe 3 via an signal transmission cable 5 to detect the signal, and a processor 7 configured to control the overall operations of SAR measurement and perform SAR calculations and data analysis.

The electric/magnetic field probe 3 may have an electric-optical (EO) converting element as the electric field sensor, and a magnetic-optical (MO) converting element as the magnetic field sensor. Alternatively, a combination of a short dipole and a waveguide-based optical modulator may be used as the electric sensor, and a combination of a metallic loop element and the waveguide-based optical modulator may be used as the magnetic sensor. The electric/magnetic field probe 3 may be a 3-axis isotropic sensor, or a single-axis sensor. The electric field sensor and the magnetic field sensor may be integrated in a single unit, or alternatively, they may be structured as separate probes. The number of electric/magnetic field probes 3 may be increased. When multiple electric/magnetic field probes 3 are used, simultaneous measurement can be performed, while narrowing the measurement range of each probe. This arrangement is advantageous because measurement time can be reduced.

A reference antenna or a reference sensor may be used, in addition to the electric/magnetic field probe 3, to detect the phase of the electric or magnetic field based on the phase difference between signals obtained by the probe 3 and the reference antenna. In this case, the electric/magnetic field probe 3 may be structured so as to simply detect the signal change. Accordingly, selection of available sensors can be expanded.

The processor 7 may be a work station or a personal computer, and operates according to a prescribed program (software). The processor 7 has a measurement operating unit 71 for controlling the measuring operations, a three-dimensional electric/magnetic field estimation unit 72, and a specific absorption rate (SAR) estimation unit 73. The three-dimensional electric/magnetic field estimation unit 72 estimates the three-dimensional distribution of the electric field (and the magnetic field as necessary) based on the two-dimensional measurement result obtained by the electric/magnetic field probe 3. The SAR estimation unit 73 estimates distribution of the specific absorption rate based on the three-dimensional distribution of the electric field calculated in the three-dimensional electric/magnetic field estimation unit 72.

Figure 4:
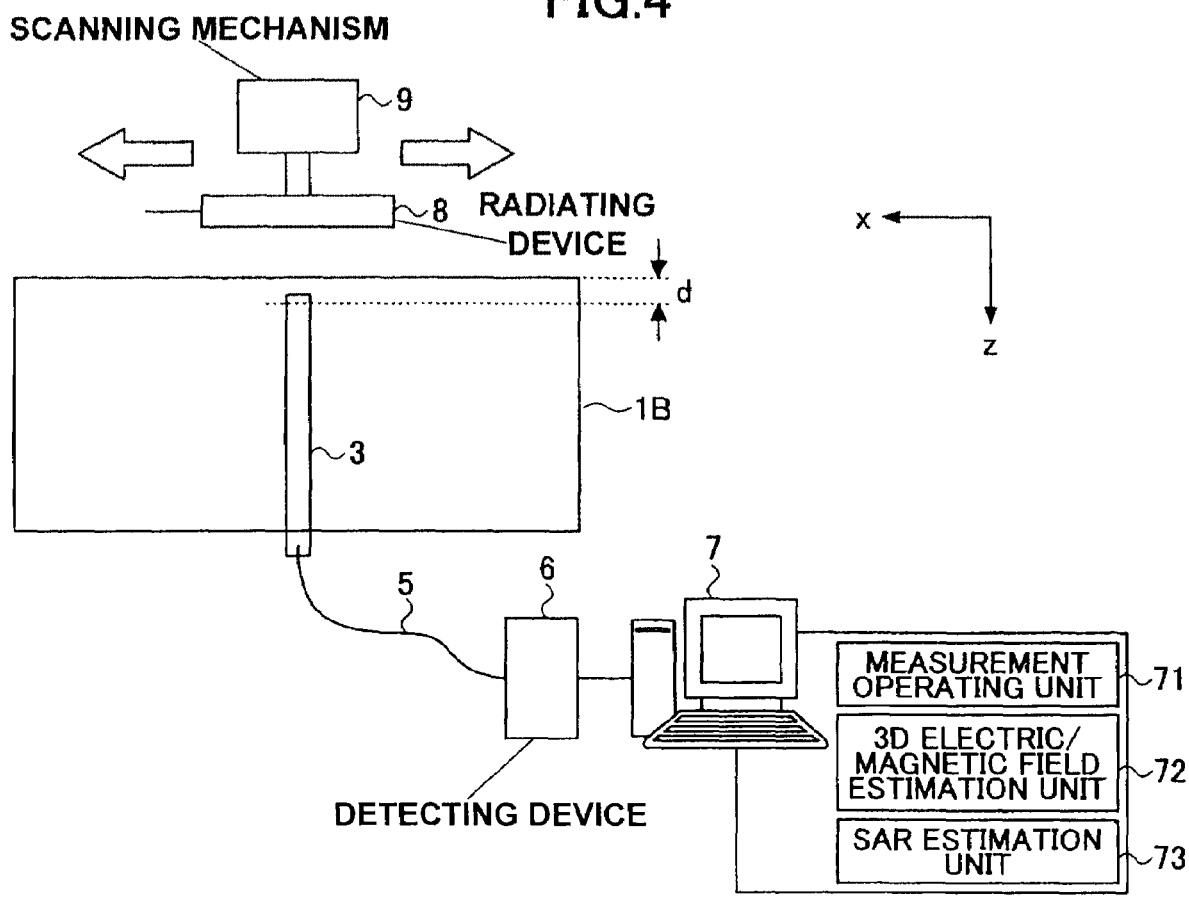
FIG. 4 is a schematic diagram illustrating another example of the SAR measuring apparatus according to the embodiment of the invention.

FIG. 4 is a schematic diagram illustrating another example of the SAR measuring apparatus using a solid phantom 1B according to the embodiment. In this example, the electric/magnetic field probe 3 inserted in the phantom 1B is fixed, while a device 8 under test, which may be a cellular phone or another electromagnetic wave radiating device, is driven by a scanning mechanism 9 in a two-dimensional plane (e.g., in the x-y plane). Under this arrangement, the amplitudes and phases of the electric/magnetic fields generated in the phantom 1B are measured. The other methods are the same as those shown in FIG. 3.

Next, explanation is made of the basic idea of the SAR measurement of the embodiment.

Figure 5:
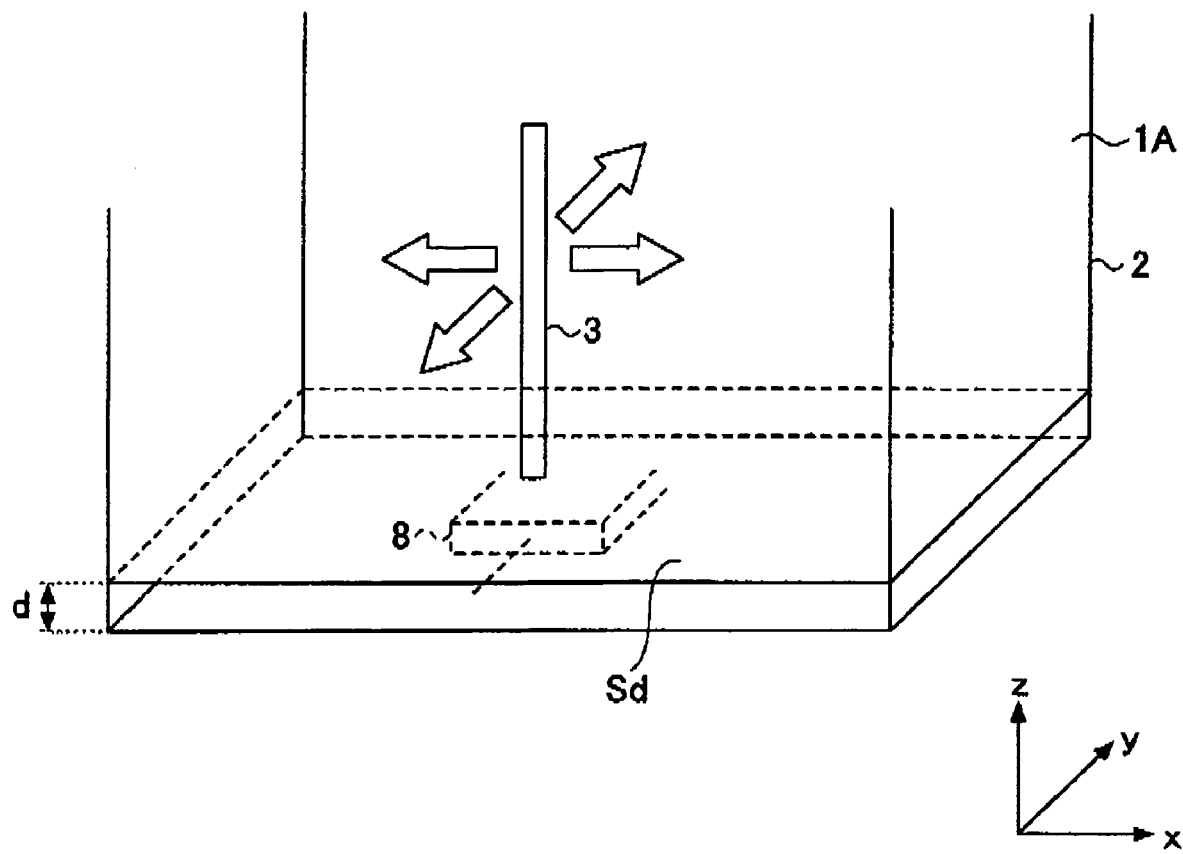
FIG. 5 is a schematic diagram illustrating measurement of a two-dimensional distribution of the electric and magnetic fields.

FIG. 5 is a schematic diagram illustrating measurement of the two-dimensional distribution of the electric and magnetic fields using the apparatus shown in FIG. 3. An electric field and a magnetic field are generated in the phantom 1A by the device 8 under test. The amplitudes and the phases of the generated electric and magnetic fields are measured in a two-dimensional manner (along the x-y plane) using the electric/magnetic field probe 3. The surface $S_d$ is located at distance "d" from the bottom of the vessel 2, and agrees with the x-y plane on which the electric/magnetic field probe 3 scans. The less the distance "d", the better the measuring performance is. Distance "d" depends on the performance of the electric/magnetic field probe 3.

If the two-dimensional distributions of the electric field and the magnetic field measured by the electric/magnetic field probe 3 are $E_d(x, y)$ and $H_d(x, y)$, respectively, then the three-dimensional electric field $E(x, y, z)$ including the E-field distribution in the z-direction can be calculated using Equation (3), $$E(x, y, z) = \frac{1}{4\pi} \int_s \{-j\omega\mu(n \times H_d(x, y))\phi + (n \times E_d(x, y)) \times \nabla'\phi + (n \cdot E_d(x, y))\nabla'\phi\} dS_d \quad (3)$$

where $\omega$ denotes angular frequency (rad/s), $\mu$ denotes magnetic permeability (H/m), n denotes unit normal vector pointing in the positive z direction from the surface $S_d$, and $\phi$ is green function.

Equation (3) represents the electric field radiated from the wave sources defined by the two-dimensional distributions of the electric field $E_d(x, y)$ and the magnetic field $H_d(x, y)$, which expression is on the assumption that the phantom 1A generally has a high dielectric constant (at or above 40), that the incident component of the electromagnetic wave radiated from the device 8 under test is relatively small other than on the surface $S_d$, and that reflection is relatively small other than from the face $S_d$. As long as these assumptions are satisfied, the shape of the vessel 2 may be arbitrary, and is not necessarily a flat shape.

The three-dimensional electric/magnetic field estimation unit 72 of the processor 7 shown in FIG. 3 and FIG. 4 calculates the three-dimensional electric field distribution $E(x, y, z)$ according to Equation (3). The SAR estimation unit 73 calculates the specific absorption rate (SAR) based on $$SAR = \frac{\sigma |E|^2}{\rho} \quad (4)$$

where $\sigma$ is electric conductivity [S/m] of a medium, and $\rho$ is density [kg/m$^3$] of the medium.

Figure 6:
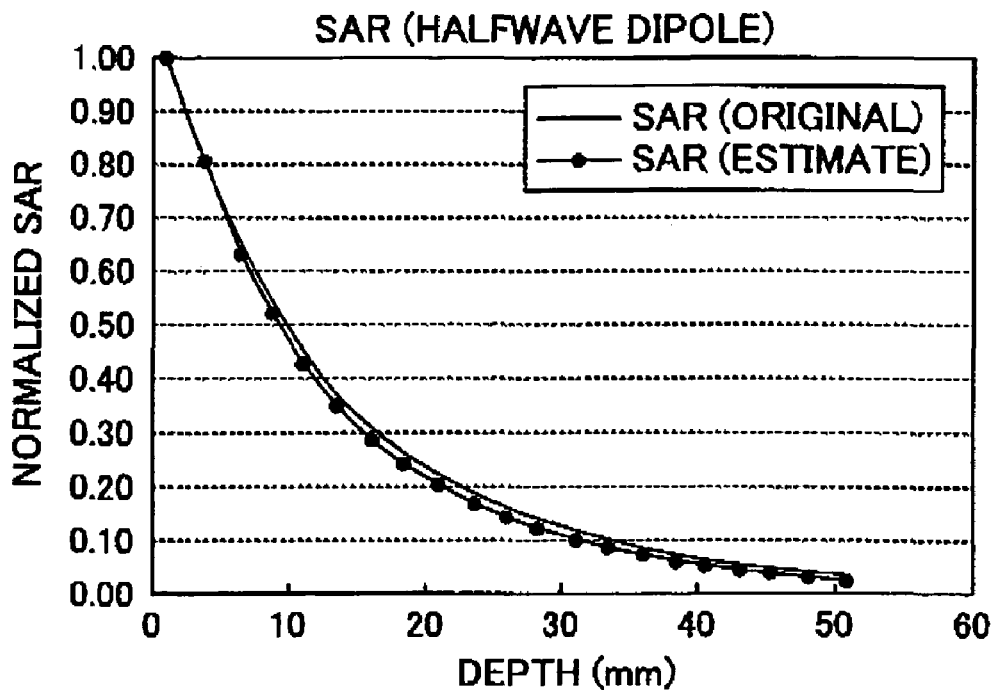
FIG. 6 is a graph showing SAR values based on the numerical analysis and estimated by the present invention, using a halfwave dipole as the radiation source.
Figure 7:
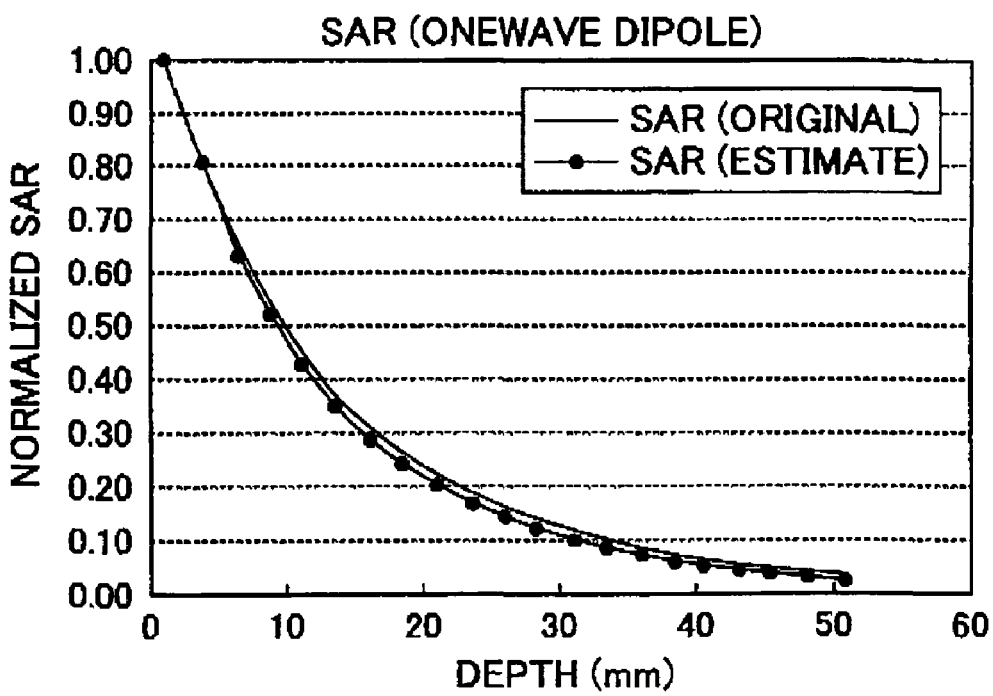
FIG. 7 is a graph showing SAR values based on the numerical analysis and estimated by the present invention, using a onewave dipole as the radiation source.

FIG. 6 is a graph showing the SAR estimation value obtained according to the embodiment, together with the theoretical SAR calculation value, when a halfwave dipole is used as the wave source. FIG. 7 is a graph showing the SAR estimation value according to the embodiment, together with the theoretical SAR calculation value, when a onewave dipole is used as the wave source. In FIG. 6 and FIG. 7, the curved line without plotted points indicates the theoretical SAR calculation value, and the plotted line indicates the SAR estimates obtained from Equations (3) and (4) based on the two-dimensional electric and magnetic field distributions. The theoretical value and the estimated value are substantially similar to each other, regardless of the antenna. This shows that the SAR estimates according to the embodiment exhibit high accuracy with respect to radiation from both the halfwave and onewave antennas. For the specific absorption rate averaged over 10 grams of phantom, the deviation in the estimated values is only about 2.0%.

Equation (3) is used to analyze the three-dimensional electric field distribution. Similarly, the three-dimensional magnetic field distribution can be estimated based on $$H(x, y, z) = \frac{1}{4\pi} \int_s \{j\omega\varepsilon(n \times E_d(x, y))\phi + (n \times H_d(x, y)) \times \nabla'\phi + (n \cdot H_d(x, y))\nabla'\phi\} dS_d \quad (5)$$

where $\varepsilon$ is permittivity [F/m].

Although, in the above-described example explained in conjunction with FIG. 3 and FIG. 4, both the electric field and the magnetic field are measured by the electric/magnetic field probe 3, only one of them may be actually measured, while the other may be determined based on calculation. When only the electric field E is measured using the probe 3, the magnetic field H can be calculated by Equation (6) of the Maxwell equations, and when only the magnetic field H is measured by the probe 3, the electric field E is calculated by Equation (7).

$$H = \frac{j}{\omega\mu} \nabla \times E \quad (6)$$

$$E = \frac{1}{\sigma + j\omega\varepsilon} \nabla \times H \quad (7)$$

By applying the Cartesian coordinate system, Equation (6) can be rewritten as Equation (8).

$$\begin{cases} H_x = \frac{1}{j\omega\mu}\left(\frac{\partial E_y}{\partial z} - \frac{\partial E_z}{\partial y}\right) \\ H_y = \frac{1}{j\omega\mu}\left(\frac{\partial E_z}{\partial x} - \frac{\partial E_x}{\partial z}\right) \\ H_z = \frac{1}{j\omega\mu}\left(\frac{\partial E_x}{\partial y} - \frac{\partial E_y}{\partial x}\right) \end{cases} \quad (8)$$

In addition, by introducing the Yee scheme to express each component in a discrete manner, Equation (8) is further rewritten as $$\begin{cases} H_x = \frac{1}{j\omega\mu}\left(\frac{E_y - E'_y}{\Delta z} - \frac{E_z - E'_z}{\Delta y}\right) \\ H_y = \frac{1}{j\omega\mu}\left(\frac{E_z - E'_z}{\Delta x} - \frac{E_x - E'_x}{\Delta z}\right) \\ H_z = \frac{1}{j\omega\mu}\left(\frac{E_x - E'_x}{\Delta y} - \frac{E_y - E'_y}{\Delta x}\right) \end{cases} \quad (9)$$

where each of $\Delta x$, $\Delta y$, and $\Delta z$ denotes distance between adjacent electric field components in the associated direction, and E and E' denote adjacent electric field components. The same applies to Equation (7), which can be rewritten in a manner similar to Equations (8) and (9).

The above-described measurement of the electric field and the magnetic field can be carried out using a single probe; however, it is desired to use multiple probes arranged in an array so as to reduce the scanning area of each probe and shorten the measurement time.

Figure 8:
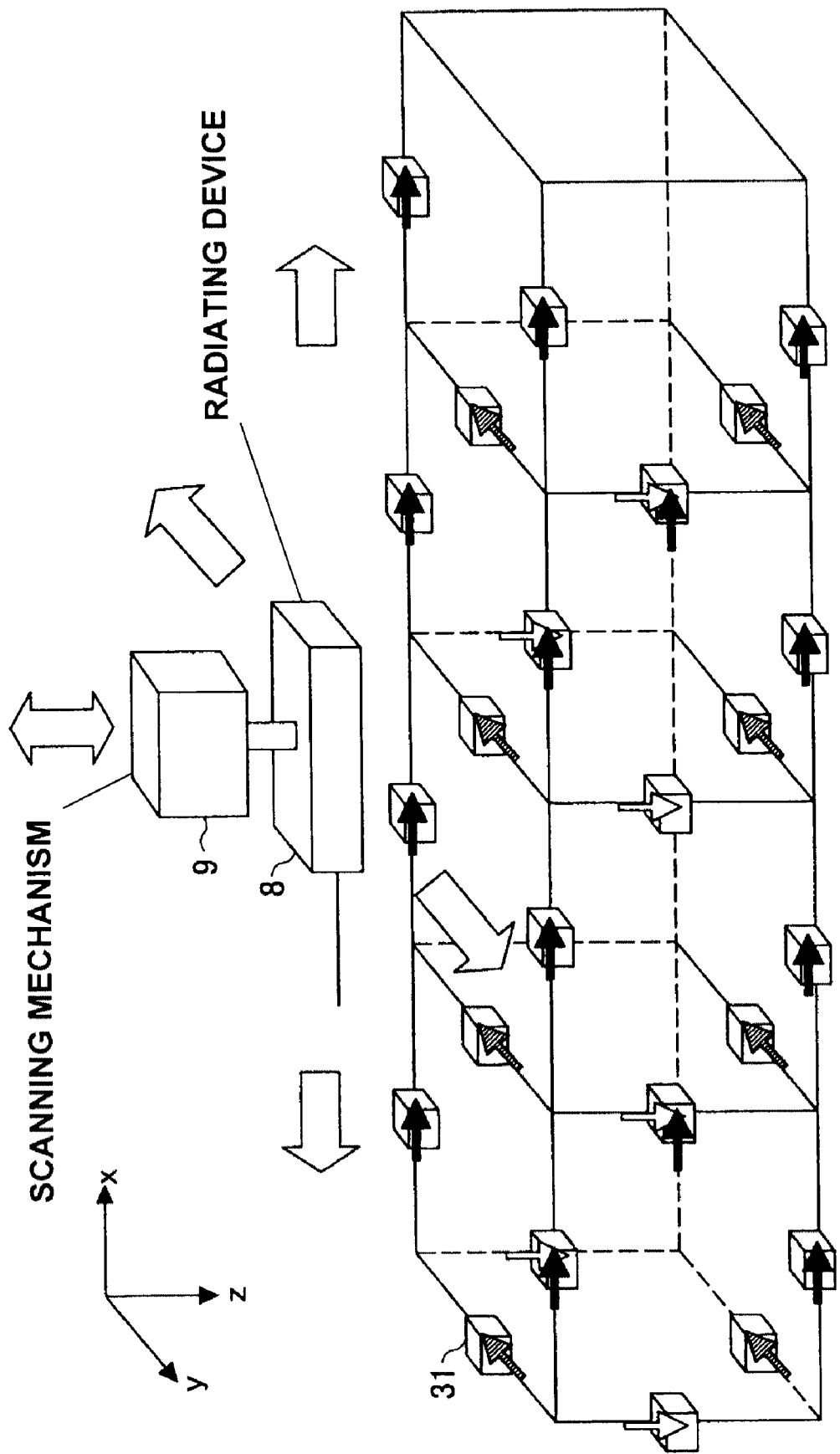
FIG. 8 is a schematic diagram illustrating an example of measurement using an arrayed probe.

FIG. 8 is a schematic diagram illustrating measurement using an arrayed probe based on the Yee scheme. In this figure, the probe tip 31 is expressed as a white cube, and the arrows depicted in the cube represent the directions of the vector components of the electric field (or the magnetic field).

When measuring the electric field using the arrayed probe, the associated magnetic field can be calculated from Equation (9). Thus, based on the measured electric field and the calculated magnetic field, the three-dimensional SAR distribution can be determined using Equations (3) and (4).

Figure 9:
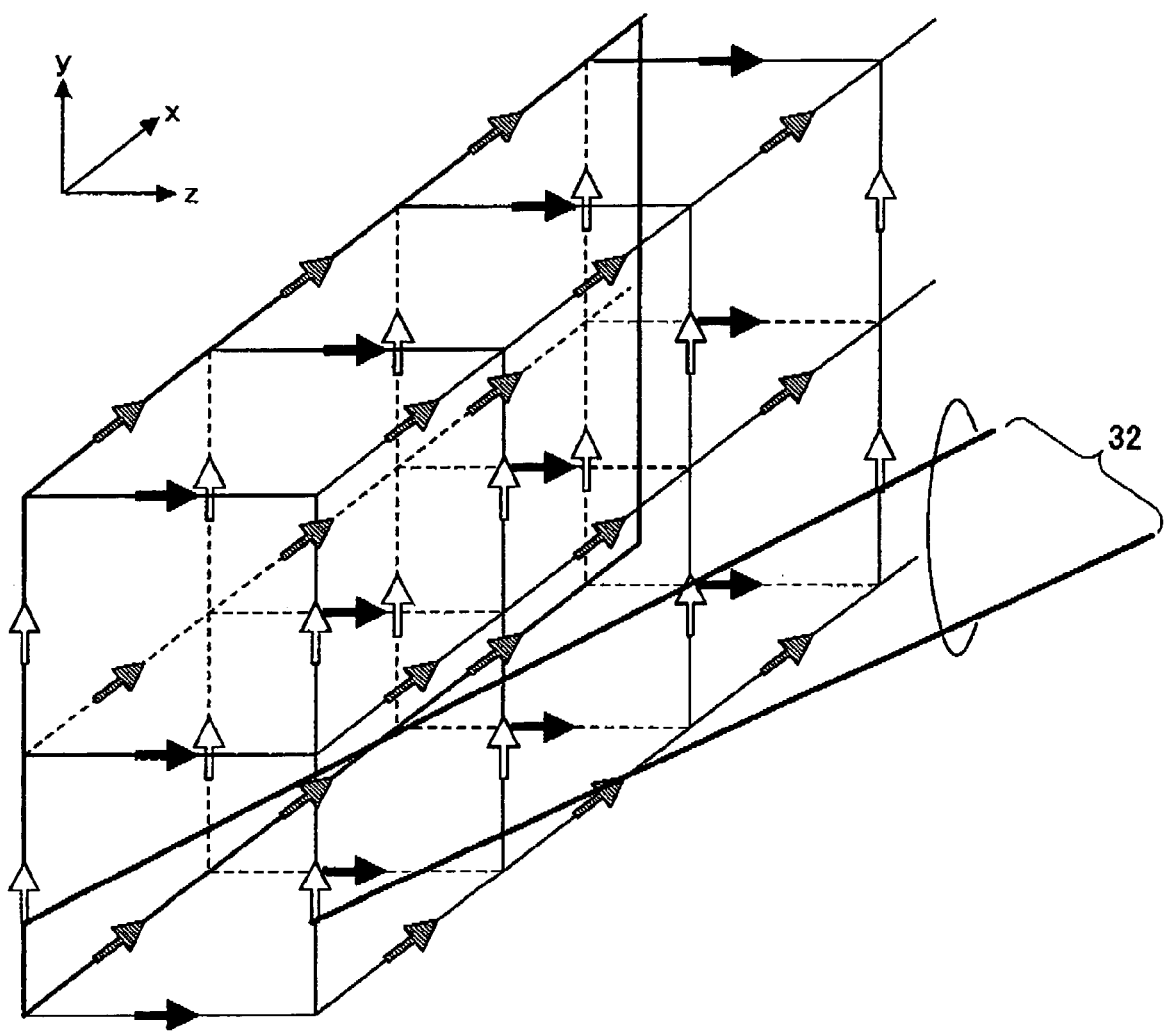
FIG. 9 is a schematic diagram illustrating a problem cased by the pull-out lines of the cable.

Using a probe array is advantageous in reducing the measurement time; however, another problem may arise. That is, it is difficult to pull out a cable from each of the probes. FIG. 9 illustrates the probe arrangement and the cables viewed from the bottom of the array shown in FIG. 8, showing the problem of cable pull-out from the probes. Since multiple probes align on a line extending in each of the x, y, and z directions, cables 32 cannot be pulled out straight away in the z direction (opposite to the dielectric surface facing the device 8). Consequently, cables 36 have to be pulled out on the bias. To pull out cable 36 obliquely from each probe, the connector structure becomes very complicated, and therefore, the probe array itself may not be realized.

Figure 10:
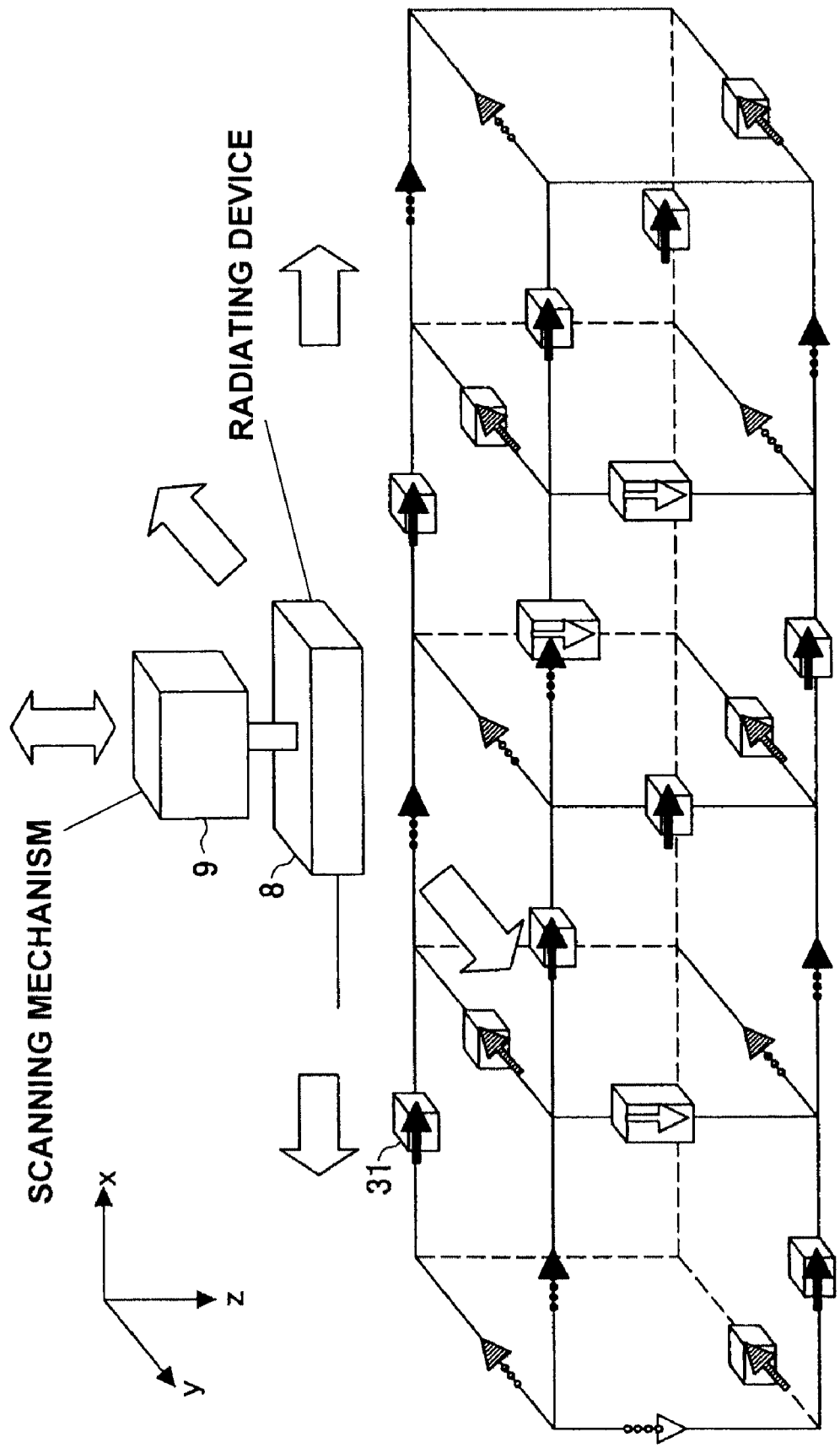
FIG. 10 is a schematic diagram illustrating an example of probe arrangement in which measuring points are arranged alternately so as to simplify cable pull-out.

FIG. 10 is a schematic diagram illustrating how the problem of cable pull-out is solved. The probe tips 31 depicted by small cubes are arranged alternately in the respective directions, and data at locations at which the probes are not placed are interpolated. Because the probes are arranged alternately in the same plane, cables can be pulled out straight away in the z direction opposite to the dielectric surface facing the device to be observed, without intersection of cables.

Figure 11:
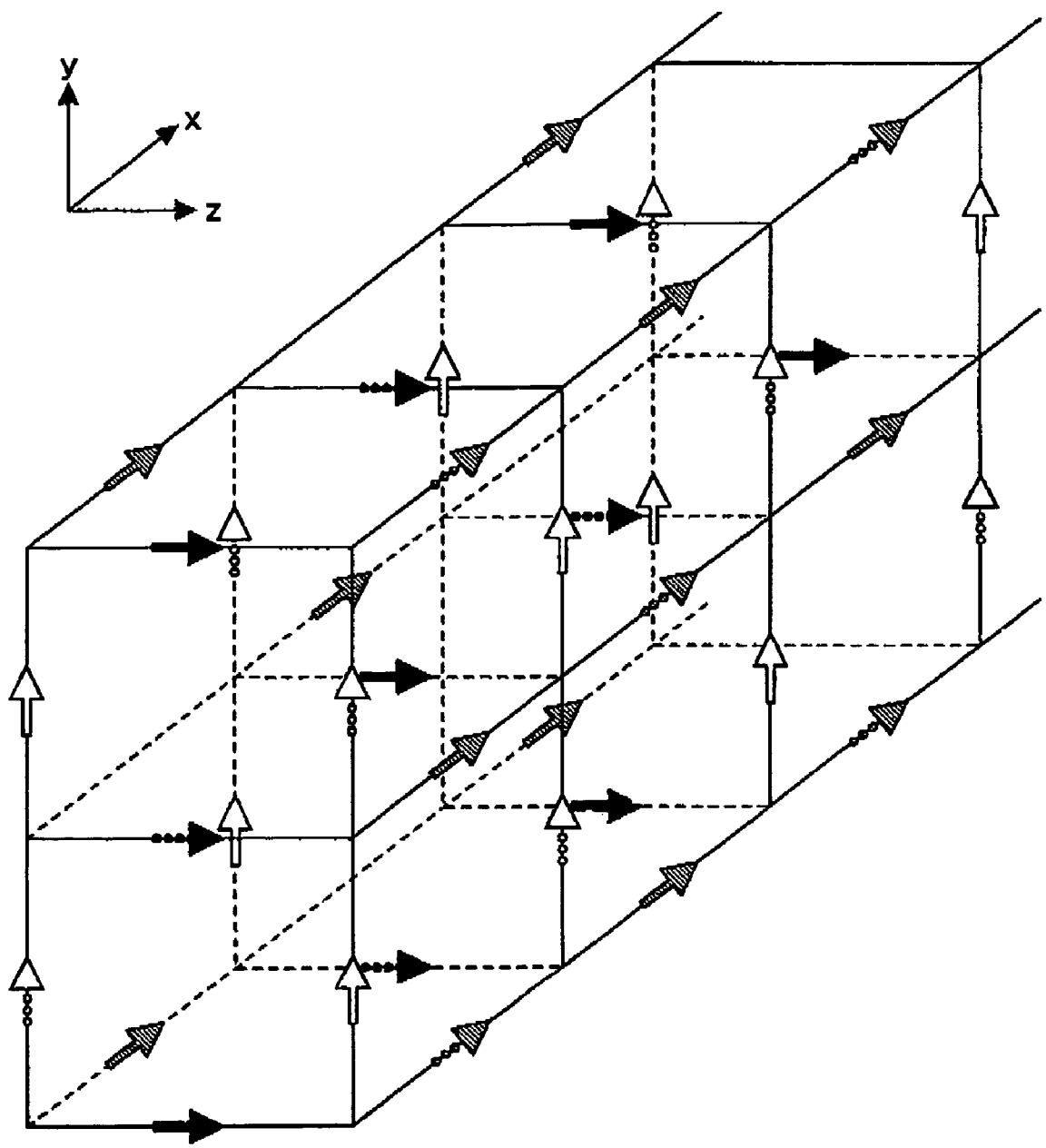
FIG. 11 is a schematic diagram illustrating the probe arrangement expanded to an array in the x and y directions.

FIG. 11 is a schematic diagram illustrating a probe array expanding the probe array shown in FIG. 10 in the y direction. The solid arrows represent the components measured at the actually arranged probes. The dotted arrows represent the interpolated components at locations without probes. When interpolating, any known interpolation technique, such as three-dimensional spline method or linear interpolation method, may be employed.

Figure 12:
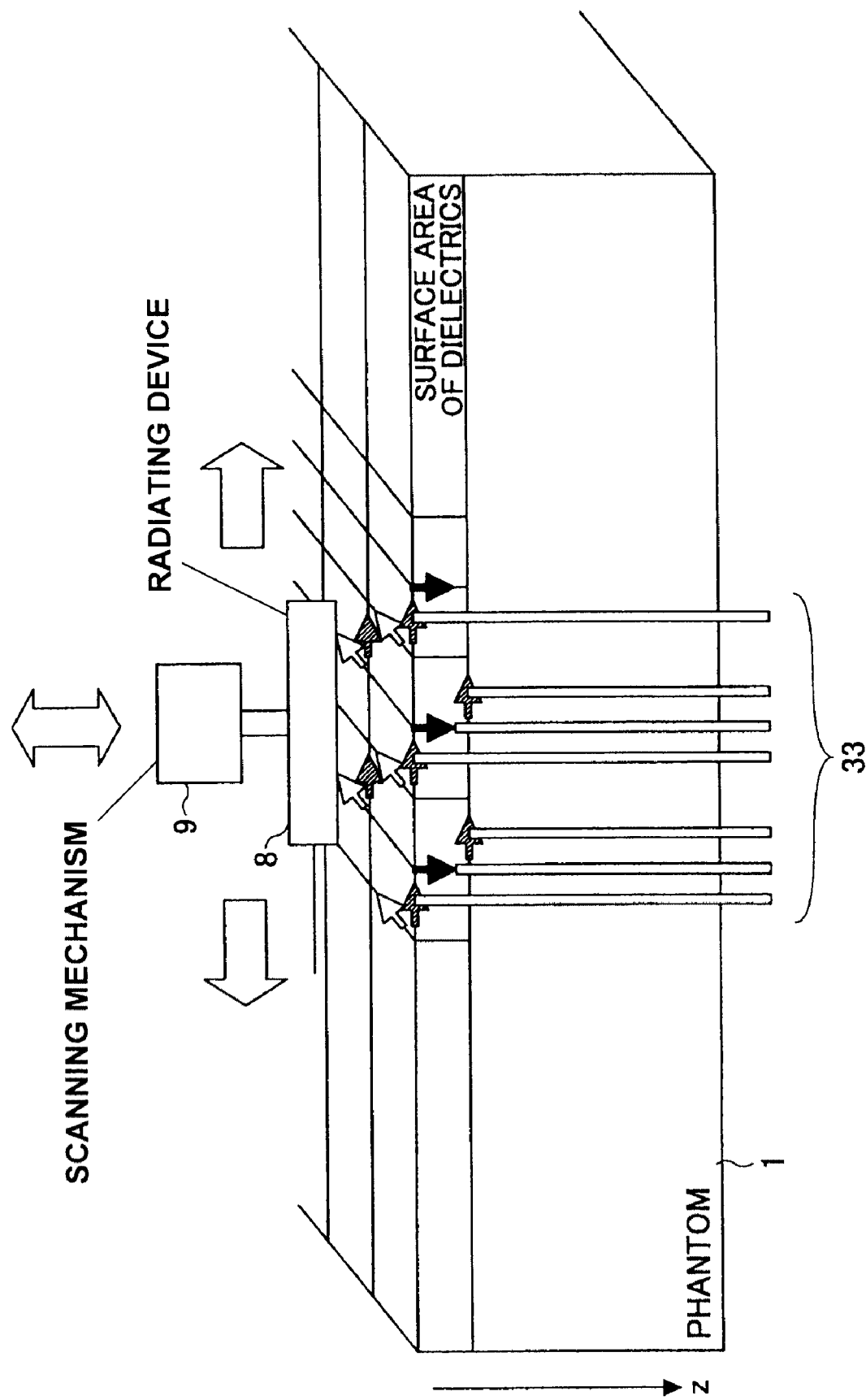
FIG. 12 is a schematic diagram illustrating an example of the probe configuration.

FIG. 12 illustrates still another example of probe arrangement. Probes 33 are arranged in an array and extend in the z direction (the depth direction) from the dielectric surface facing the device 8 attached to the phantom 1.

Figure 13:
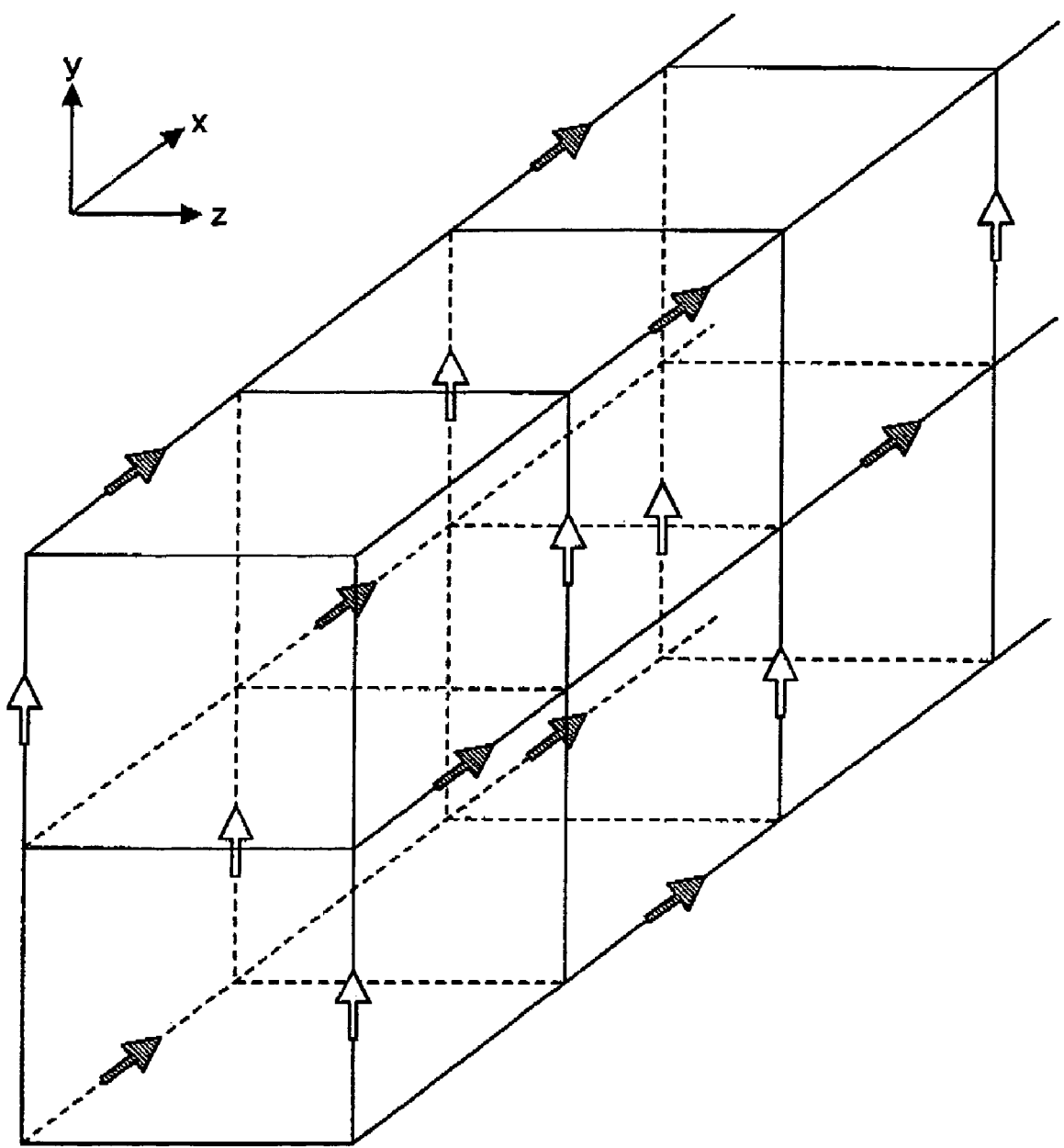
FIG. 13 is a schematic diagram of a probe arrangement from which z-direction measuring points are omitted.

FIG. 13 is a schematic diagram illustrating measurement of x and y components of the electric (or magnetic) field, omitting measuring points in the z direction (the depth direction). The electromagnetic component incident normal to the dielectrics is attenuated conspicuously in the depth (z) direction, and such a component does not greatly influence the SAR measurement. Accordingly, the z component in the depth direction may be omitted. This arrangement is advantageous because the number of probes is reduced and the measurement analysis can be simplified.

FIG. 14 is a schematic diagram illustrating calibration using a reference antenna or the like. A reference antenna (or sensor) 10 to be used as a measurement reference is placed at a position without affecting the measurement, in addition to the probe array 33 placed in the phantom 1. The probe array 33 and the reference antenna 10 are controlled so as to maintain the distances (x1, x2, . . . , xN) between the reference antenna 10 and the respective probe elements of the probe array 33. As the reference antenna 10, for example, a dipole antenna suitable for easy analysis can be used, and accordingly, the theoretical value of the electromagnetic field can be calculated at each of the probe positions. By comparing the actually measured values and the calculated theoretical values at each probe position, calibration of probe can be performed. Even if the probe 33 deviates from the correct position in the phantom 1, the influence of the deviation can be corrected based on the calibration, and accurate measurement can be guaranteed.

FIG. 15 illustrates a measurement example to which combination of the equivalent theorem represented by Equation (3) and the decay function is applied. In this example, the equivalent theorem is applied only to the maximum point (or portion) "a" of the measured two-dimensional electric field distribution, instead of estimating all the three-dimensional distribution using the equivalent theorem. For the remaining points (or portions) "b", the three-dimensional distribution is estimated using the decay function calculated from the equivalent theorem.

In operation, the equivalent theorem is first applied to estimate the distribution in the depth direction (the Z direction) at the peak position of the electric field. In the depth direction distribution, the depth (or the distance from the surface in the depth direction) at which the SAR value becomes $1/e^2$ of the surface SAR is set to $\delta$. Then, three-dimensional SAR distribution is estimated using $\delta$ obtained from the equivalent theorem, based on Equation (10), $$SAR(x, y, z) = SAR(x, y, z_d) \times S(z, z_d) = SAR(x, y, z_d) \times e^{\frac{-2(z-z_d)}{\delta}} \quad (10)$$

where $SAR(x, y, z_d)$ represents the SAR distribution at position $z_d$ in the depth direction from the phantom surface, and $S(z, z_d)$ represents an decay function. By multiplying the measured two-dimensional electric field distribution by the decay function according to the distance (or depth), the three-dimensional SAR distribution is estimated. With this arrangement, the computational effort for the equivalent theorem is greatly reduced, and the estimation speed is increased. Since the theoretically calculated decay function is used, estimation accuracy is not degraded greatly, maintaining the estimation error at about a few percent. Thus, the measurement accuracy of the method shown in FIG. 15 is similar to that of full application of the equivalent theorem.

Although the present invention has been explained based on specific examples, the invention is not limited to these examples. Many modifications and substitutions can be made without departing from the scope of the invention defined by the appended claims.

This patent application is based on and claims the benefit of the earlier filing dates of Japanese Patent Applications No. 2004-198050 filed Jul. 5, 2004 and No. 2005-189720 filed Jun. 29, 2005, the entire contents of which are hereby incorporated by reference.

What is claimed is:

1. A specific absorption rate measuring apparatus, comprising:
    a probe configured to measure, in a two-dimensional plane for a two-dimensional distribution of points, an amplitude and a phase of an electric or magnetic field generated in a phantom having electrical properties similar to those of human body tissues;
    a field estimation unit configured to estimate a three-dimensional electric or magnetic field distribution to be produced from a wave source defined by the measured two-dimensional distribution at a specific measuring point, based on a measurement result of the probe at the specific measuring point; and
    a specific absorption rate estimation unit configured to estimate a three-dimensional distribution of a specific absorption rate for points other than the specific measuring point from the estimated three-dimensional electric or magnetic field distribution.

2. The specific absorption rate measuring apparatus of claim 1, wherein the probe measures the amplitude and the phase of the electric field, as well as the amplitude and the phase of the magnetic field, in the two-dimensional plane.

3. The specific absorption rate measuring apparatus of claim 1, wherein:

the probe measures the amplitude and the phase of one of the two-dimensional distribution of the electric field and magnetic field in the phantom, and the field estimation unit estimates the distribution of the non-measured remaining field based on the measured two-dimensional distribution of the electric or magnetic field.

4. The specific absorption rate measuring apparatus of claim 3, wherein if only one of the electric and magnetic fields is measured, the field estimation unit calculates the distribution of the remaining field based on the measured two-dimensional distribution of said one of the electric and magnetic fields using the Maxwell's equations.

5. The specific absorption rate measuring apparatus of claim 1, wherein the phantom is formed of a liquid material, and the probe is moved in the two-dimensional plane within the phantom.

6. The specific absorption rate measuring apparatus of claim 1, wherein the phantom is formed of a solid material, the probe is fixed in the phantom, and measurement is carried out by scanning an electromagnetic wave radiating device in a two-dimensional manner.

7. The specific absorption rate measuring apparatus of claim 1, wherein:
the field estimation unit estimates the three-dimensional electric field distribution E(x, y, z) from $$E(x, y, z) = \frac{1}{4\pi}\int_s \{-j\omega\mu(n \times H_d(x, y))\phi + (n \times E_d(x, y)) \times \nabla'\phi + (n \cdot E_d(x, y))\nabla'\phi\} dS_d$$

where $S_d$ is a measuring surface located at distance "d" from a surface of the phantom, $E_d$ (x, y) is the two-dimensional electric field distribution on the measuring surface, $H_d$ (x, y) is the magnetic field distribution, $\omega$ is angular frequency, $\mu$ is magnetic permeability, n is a unit normal vector pointing the positive z direction from the measuring surface, and $\phi$ is green function, and the specific absorption rate estimation unit estimates
the specific absorption rate (SAR) based on $$SAR = \frac{\sigma|E|^2}{\rho}$$

where $\sigma$ is electric conductivity, and $\rho$ is density of the phantom.

8. The specific absorption rate measuring apparatus of claim 1, wherein the probe has an electric-optical converting element as an electric field sensor, and a magnetic-optical converting element as a magnetic field sensor.

9. The specific absorption rate measuring apparatus of claim 1, wherein the probe has a short dipole and waveguide-based optical modulator as an electric field sensor, and has a metallic loop element and waveguide-based optical modulator as a magnetic sensor.

10. The specific absorption rate measuring apparatus of claim 8 or 9, wherein the probe is a triaxis sensor or a single-axis sensor.

11. The specific absorption rate measuring apparatus of claim 1, wherein the probe is a probe system, which comprises a single probe element.

12. The specific absorption rate measuring apparatus of claim 1, wherein the probe is a probe system, which comprises multiple probe elements.

13. The specific absorption rate measuring apparatus of claim 1, wherein the probe is a probe system, which has an probe array using multiple probe elements.

14. The specific absorption rate measuring apparatus of claim 13, wherein the probe elements are arranged alternately along each axis of the array.

15. The specific absorption rate measuring apparatus of claim 1, wherein interpolation values are obtained between adjacent points of the two-dimensional distribution, and the interpolation values are used as a part of the measurement result.

16. The specific absorption rate measuring apparatus of claim 1, wherein the probe measures components of the electric or magnetic field other than components incident to the phantom vertically.

17. The specific absorption rate measuring apparatus of claim 1, further comprising:
a reference antenna or a reference sensor for measuring the phase of the electric or magnetic field.

18. The specific absorption rate measuring apparatus of claim 1, further comprising:
a reference antenna or a reference sensor for calibrating the probe.

19. The specific absorption rate measuring apparatus of claim 1, wherein the field estimation unit estimates a first three-dimensional distribution of the electric field to be radiated from the wave source defined by the two-dimensional distribution of the electric or magnetic field at a peak, and estimates a second three-dimensional distribution of the electric field for the remaining portion based on an decay function calculated from the first three-dimensional distribution of the electric or magnetic field at the peak.

20. An electric/magnetic field distribution measuring apparatus, comprising:
a probe configured to measure an amplitude and a phase of a two-dimensional electric or magnetic field generated in a phantom of which electrical properties similar to those of human body tissues; and
an estimation unit configured to estimate a three-dimensional distribution of an electric field radiated from a wave source defined by the two-dimensional electric and magnetic fields measured by the probe at a measuring point, and further configured to estimate a three-dimensional magnetic field distribution H(x, y, z) based on $$H(x, y, z) = \frac{1}{4\pi}\int_s \{j\omega\delta(n \times E_d(x, y))\phi + (n \times H_d(x, y)) \times \nabla'\phi + (n \cdot H_d(x, y))\nabla'\phi\} dS_d$$

where $S_d$ is a measuring surface located at distance d from a surface of the phantom, $E_d$ (x, y) is the two-dimensional electric field distribution on the measuring surface, $H_d$ (x, y) is the magnetic field distribution, $\omega$ is angular frequency, $\epsilon$ is dielectric constant, n is a unit normal vector pointing in the positive z direction from the measuring surface, and $\phi$ is a green function.

* * * * *